(12) United States Patent
Liao et al.

(10) Patent No.: US 11,043,492 B2
(45) Date of Patent: Jun. 22, 2021

(54) SELF-ALIGNED GATE EDGE TRIGATE AND FINFET DEVICES

(71) Applicant: Intel Corporation, Santa Clara, CA (US)

(72) Inventors: Szuya S. Liao, Portland, OR (US); Biswajeet Guha, Hillsboro, OR (US); Tahir Ghani, Portland, OR (US); Christopher N. Kenyon, Portland, OR (US); Leonard P. Guler, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 16/098,084

(22) PCT Filed: Jul. 1, 2016

(86) PCT No.: PCT/US2016/040804
§ 371 (c)(1),
(2) Date: Oct. 31, 2018

(87) PCT Pub. No.: WO2018/004680
PCT Pub. Date: Jan. 4, 2018

(65) Prior Publication Data
US 2019/0139957 A1    May 9, 2019

(51) Int. Cl.
*H01L 27/092* (2006.01)
*H01L 21/8238* (2006.01)
(Continued)

(52) U.S. Cl.
CPC .... *H01L 27/0924* (2013.01); *H01L 21/76895* (2013.01); *H01L 21/823821* (2013.01);
(Continued)

(58) Field of Classification Search
CPC .......... H01L 27/0924; H01L 21/76895; H01L 29/66545; H01L 29/66795; H01L 21/823821; H01L 21/823878
See application file for complete search history.

(56) References Cited

U.S. PATENT DOCUMENTS

2013/0193548 A1* 8/2013 Kim ........................ H01L 29/04
257/506
2015/0041950 A1 2/2015 Li et al.
(Continued)

FOREIGN PATENT DOCUMENTS

WO    WO-2015094305    6/2015

OTHER PUBLICATIONS

International Preliminary Report on Patentability for International Patent Application No. PCT/US2016/040804 dated Jan. 10, 2019, 14 pgs.
(Continued)

*Primary Examiner* — Nathan W Ha
(74) *Attorney, Agent, or Firm* — Schwabe, Williamson & Wyatt, P.C.

(57) ABSTRACT

Self-aligned gate edge trigate and finFET devices and methods of fabricating self-aligned gate edge trigate and finFET devices are described. In an example, a semiconductor structure includes a plurality of semiconductor fins disposed above a substrate and protruding through an uppermost surface of a trench isolation region. A gate structure is disposed over the plurality of semiconductor fins. The gate structure defines a channel region in each of the plurality of semiconductor fins. Source and drain regions are on opposing ends of the channel regions of each of the plurality of semiconductor fins, at opposing sides of the gate structure. The semiconductor structure also includes a plurality of gate edge isolation structures. Individual ones of the plurality of
(Continued)

gate edge isolation structures alternate with individual ones of the plurality of semiconductor fins.

16 Claims, 13 Drawing Sheets

(51) Int. Cl.
    *H01L 29/78*     (2006.01)
    *H01L 29/66*     (2006.01)
    *H01L 21/768*     (2006.01)
    *H01L 23/535*     (2006.01)

(52) U.S. Cl.
    CPC .... *H01L 21/823878* (2013.01); *H01L 23/535* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 2015/0061040 A1 | 3/2015 | Bergendahl et al. |
| 2015/0076608 A1 | 3/2015 | Cheng et al. |
| 2015/0270222 A1* | 9/2015 | Alptekin ............... H01L 29/665 257/288 |
| 2016/0020210 A1* | 1/2016 | Liaw ............... H01L 21/823878 257/369 |
| 2016/0056181 A1 | 2/2016 | Anderson et al. |
| 2016/0322358 A1* | 11/2016 | Ching ............. H01L 21/823878 |
| 2016/0322501 A1* | 11/2016 | Cheng ................... H01L 29/165 |
| 2016/0380052 A1* | 12/2016 | Kim ..................... H01L 27/1211 257/401 |
| 2017/0005102 A1* | 1/2017 | Feng ................... H01L 27/0924 |
| 2017/0033107 A1* | 2/2017 | Hong ................... H01L 29/7846 |
| 2017/0077286 A1* | 3/2017 | Lo ................... H01L 21/823807 |
| 2017/0229351 A1* | 8/2017 | Fung ............... H01L 21/823878 |
| 2019/0304971 A1* | 10/2019 | Hafez ................... H01L 23/528 |
| 2019/0363026 A1* | 11/2019 | Lee ................. H01L 21/823885 |

OTHER PUBLICATIONS

International Search Report and Written Opinion for International Patent Application No. PCT/US2016/040804 dated Apr. 26, 2017, 17 pgs.

* cited by examiner

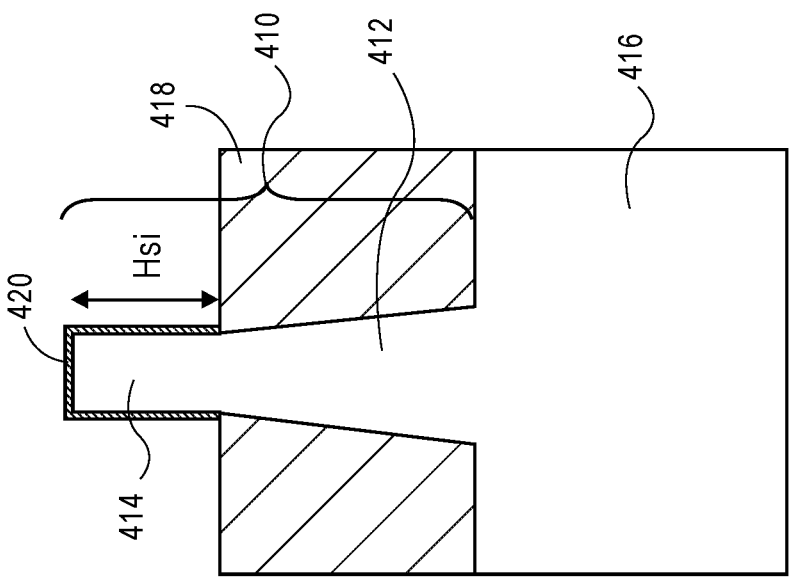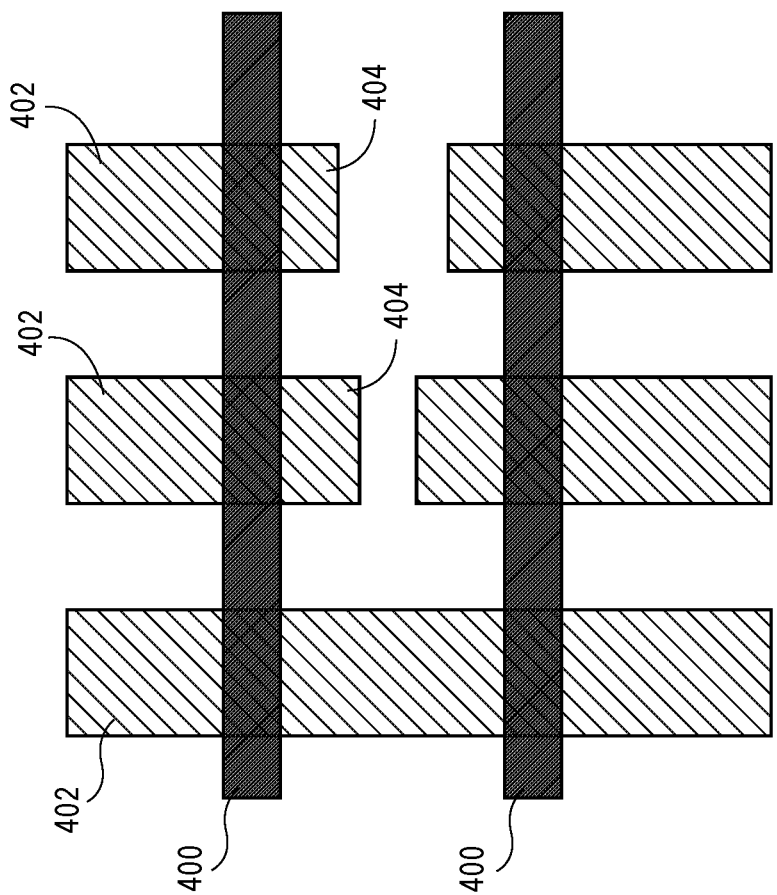
FIG. 4B
FIG. 4A

SELF-ALIGNED GATE EDGE TRIGATE AND FINFET DEVICES

CROSS-REFERENCE TO RELATED APPLICATION

This patent application is a U.S. National Phase Application under 35 U.S.C. § 371 of International Application No. PCT/US2016/040804, filed Jul. 1, 2016, entitled "SELF-ALIGNED GATE EDGE TRIGATE AND FINFET DEVICES," which designates the United States of America, the entire disclosure of which is hereby incorporated by reference in its entirety and for all purposes.

TECHNICAL FIELD

Embodiments of the invention are in the field of semiconductor devices and processing and, in particular, self-aligned gate edge trigate and finFET devices and methods of fabricating self-aligned gate edge trigate and finFET devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4C illustrate various plan and cross-sectional views of conventional finFET or tri-gate structures.

DESCRIPTION OF THE EMBODIMENTS

Figure 1:
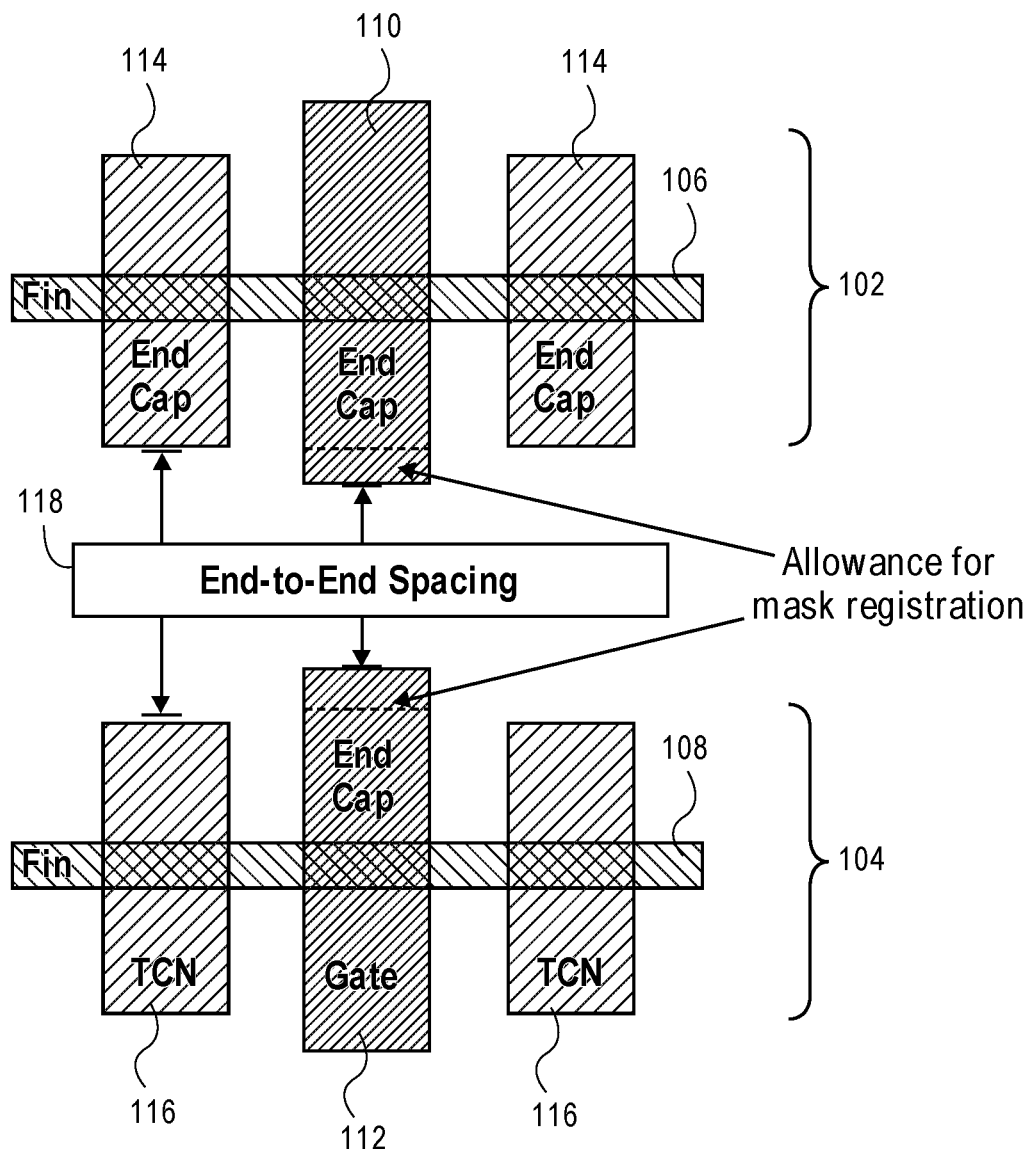
FIG. 1 illustrates a plan view of a layout including fin-based semiconductor devices accommodating end-to-end spacing.

Self-aligned gate edge trigate and finFET devices and methods of fabricating self-aligned gate edge trigate and finFET devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments of the present invention are directed to semiconductor structures or devices having one or more gate edge structures (e.g., as gate isolation regions) of gate electrodes of the semiconductor structures or devices. One or more embodiments are directed to the fabrication of local interconnects for such gate electrode structures. Additionally, methods of fabricating gate edge isolation structures in a self-aligned manner are also described. In one or more embodiments, self-aligned gate edge structures are fabricated for logic transistors based on complementary metal oxide semiconductor (CMOS) devices.

To provide context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 1 illustrates a plan view of a layout 100 including fin-based semiconductor devices accommodating end-to-end spacing. Referring to FIG. 1, first 102 and second 104 semiconductor devices are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present invention, approaches are described which provide for self-aligned gate endcap and TCN overlap of a semiconductor fin without any need to allow for mask registration. In one such embodiment, a disposable spacer is fabricated on the semiconductor fin edges which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 2A-2D illustrate cross-sectional views of process operations of significance in a conventional finFET or tri-gate process fabrication scheme, while FIGS. 3A-3D illustrate cross-sectional views of process operations of significance in a self-aligned gate edge process fabrication scheme for finFET or tri-gate devices, in accordance with an embodiment of the present invention.

Figure 2A:
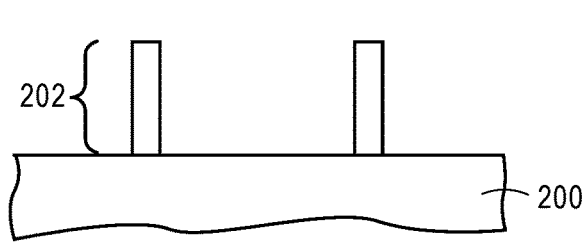
FIGS. 2A-2D illustrate cross-sectional views of process operations of significance in a conventional finFET or tri-gate process fabrication scheme.
Figure 3A:
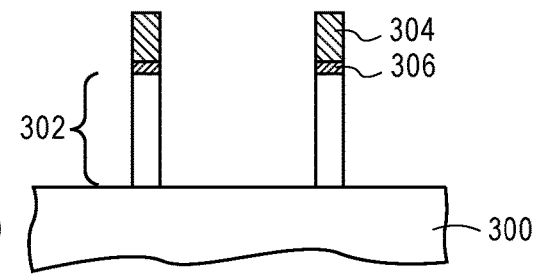
FIGS. 3A-3D illustrate cross-sectional views of process operations of significance in a self-aligned gate edge process fabrication scheme for finFET or tri-gate devices.

Referring to FIGS. 2A and 3A, a bulk semiconductor substrate 200 or 300, such as a bulk single crystalline silicon substrate is provided having fins 202 or 302, respectively, etched therein. In an embodiment, the fins are formed directly in the bulk substrate 200 or 300 and, as such, are formed continuous with the bulk substrate 200 or 300. It is to be appreciated that within the substrate 200 or 300, shallow trench isolation structures may be formed between fins. Referring to FIG. 3A, a hardmask layer 304, such as a silicon nitride hardmask layer, and a pad oxide layer 306, such as a silicon dioxide layer, remain atop fins 302 following patterning to form the fins 302. By contrast, referring to FIG. 2A, such a hardmask layer and pad oxide layer have been removed.

Figure 2B:
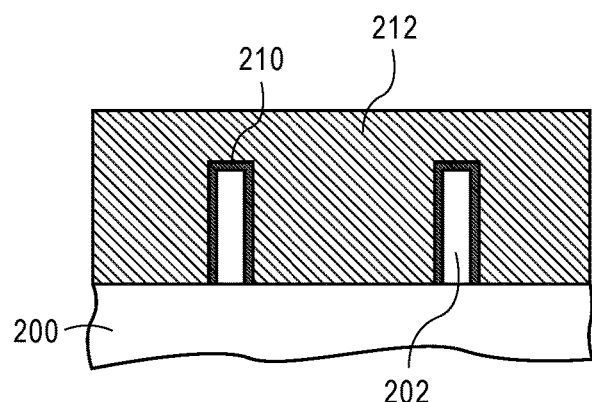
Figure 3B:
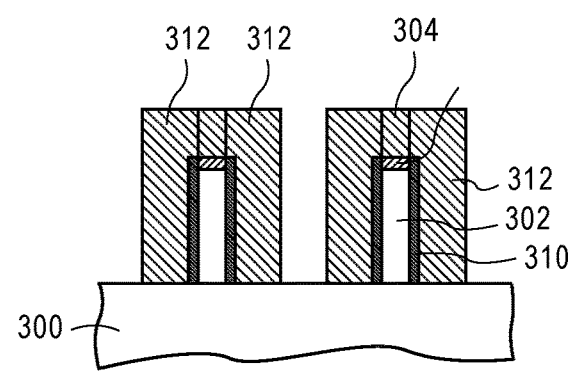

Referring to FIG. 2B, a dummy or permanent gate dielectric layer 210 is formed on the exposed surfaces of the semiconductor fins 202, and a dummy gate layer 212 is formed over the resulting structure. By contrast, referring to FIG. 3B, a dummy or permanent gate dielectric layer 310 is formed on the exposed surfaces of the semiconductor fins 302, and dummy spacers 312 are formed adjacent to the resulting structure.

Figure 2C:
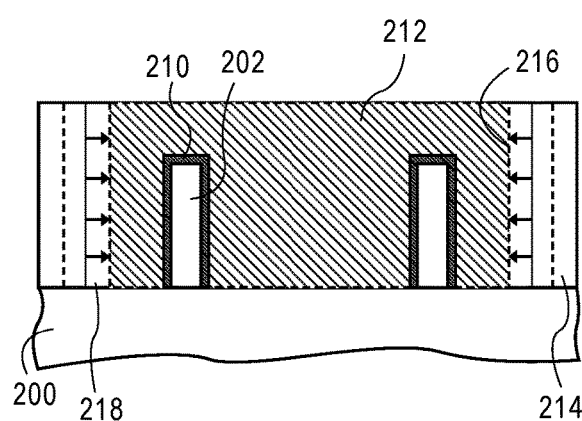

Referring to FIG. 2C, gate endcap cut patterning is performed and isolation regions 214 are formed at the resulting patterned dummy gate ends 216. In the conventional process scheme, a larger gate endcap must be fabricated to allow for gate mask mis-registration, as depicted by the arrowed regions 218. By contrast, referring to FIG. 3C, self-aligned isolation regions 314 are formed by providing an isolation layer over the structure of FIG. 3B, e.g., by deposition and planarization. In one such embodiment, the self-aligned gate endcap process does not require extra space for mask registration, as compared in FIGS. 2C and 3C.

Figure 2D:
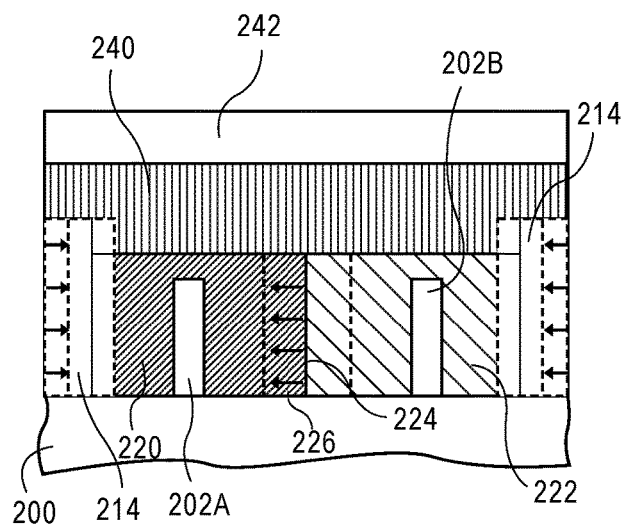

Referring to FIG. 2D, the dummy gate electrode 212 of FIG. 2C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 220 over a first semiconductor fin 202A and to provide a P-type gate electrode 222 over a second semiconductor fin 202B. The N-type gate electrode 220 and the P-type gate electrode 222 are formed between the gate edge isolations structures 214, but form a P/N junction 224 where they meet. The exact location of the P/N junction 224 may vary, depending on mis-registration, as depicted by the arrowed region 226.

Figure 3C:
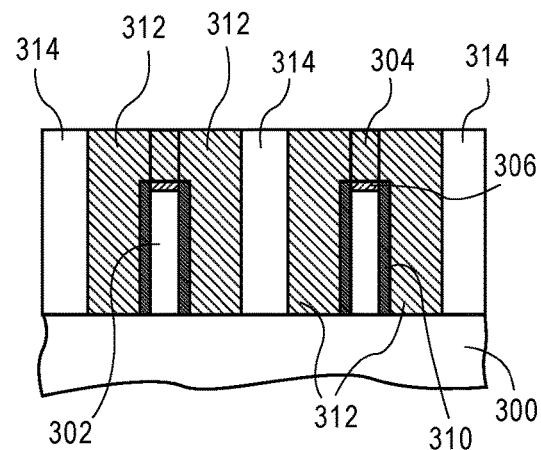
Figure 3D:
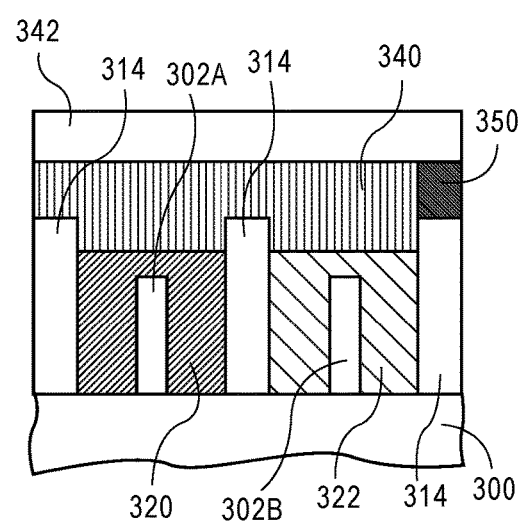

By contrast, referring to FIG. 3D, the hardmask layer 304 and pad oxide layer 306 are removed, and the dummy spacers 314 of FIG. 3C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 320 over a first semiconductor fin 302A and to provide a P-type gate electrode 322 over a second semiconductor fin 302B. The N-type gate electrode 320 and the P-type gate electrode 322 are formed between, and are also separated by, the gate edge isolations structures 314.

Referring again to FIG. 2D, a local interconnect 240 may be fabricated to contact N-type gate electrode 220 and P-type gate electrode 322 to provide a conductive path around the P/N junction 224. Likewise, referring to FIG. 3D, a local interconnect 340 may be fabricated to contact N-type gate electrode 320 and P-type gate electrode 322 to provide a conductive path over the intervening isolation structure 314 there between. Referring to both FIGS. 2D and 3D, a hardmask 242 or 342 may be formed on the local interconnect 240 or 340, respectively. Referring to FIG. 3D in particular, in an embodiment, the continuity of the local interconnect 340 is interrupted by a dielectric plug 350 in cases where a break in electrical contact along a gate line are needed.

In accordance with one or more embodiments of the present invention, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process would enable independent optimization of different cells for power and performance. An integrated process flow enabling both features may be implemented to meet scaling and performance challenges for future CMOS technology. Embodiments described herein may involve the fabrication of gate edge isolation structures, which may also be referred to as gate walls.

To provide further context, it is to be appreciated that gate endcap scaling is typically limited by lithography mis-registration margin and etch-bias, and contributes to poor transistor density and increased gate capacitance. To provide illustrative context, FIGS. 4A-4C illustrate various plan and cross-sectional views of conventional finFET or tri-gate structures.

Figure 4C:
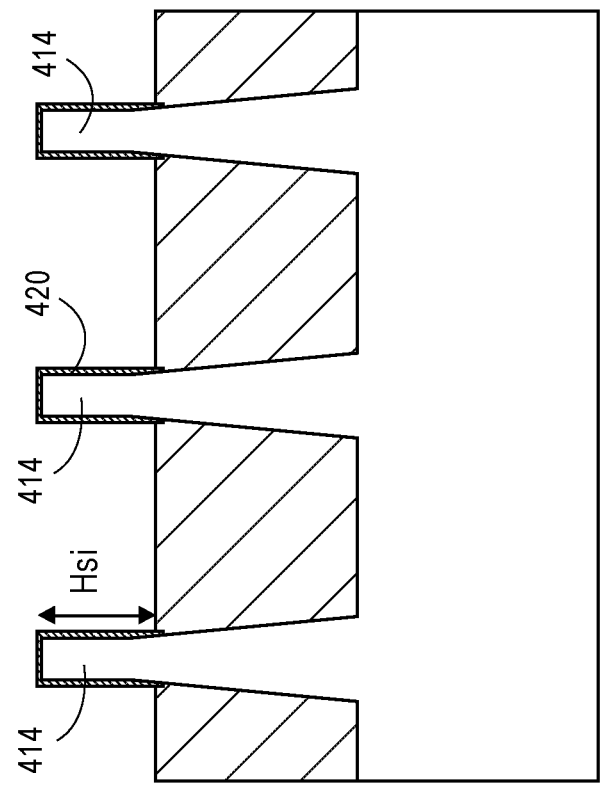

Referring to FIG. 4A, a plan view is shown to demonstrate gate endcap and end-to-end spacing. A plurality of gates 402 is over a plurality of fins 400. Breaks in the gate line are shown as end caps 404. Without gate walls, the spacing between endcaps may vary. FIG. 4B is a cross-sectional view of a single fin 410 formed from a substrate 416, shown following conventional shallow trench isolation recessing. The fin 410 has a lower fin portion 412 and an upper fin portion 414. The upper fin portion 414 is the portion that protrudes above an uppermost surface of the trench isolation region 418, and may be designated to have a height, Hsi. An oxide layer 420 may be formed on the upper portion, depending on the stage of process, as is described in greater detail below. FIG. 4C is a cross-sectional view of a plurality of fins spaced apart along a same direction.

In accordance with one or more embodiments described herein, an integrated FINFET process flow enables self-aligned gate endcap (SAGE). In one embodiment, SAGE is fabricated disposable spacers around the fins. The gate end-to-end space is defined by a SAGE wall, which is robust to all downstream processes. Since the process is a self-aligned process, in one embodiment, no extra endcap margin is required for mask mis-registration, enabling orthogonal to gate (OGD) scaling.

Figure 5:
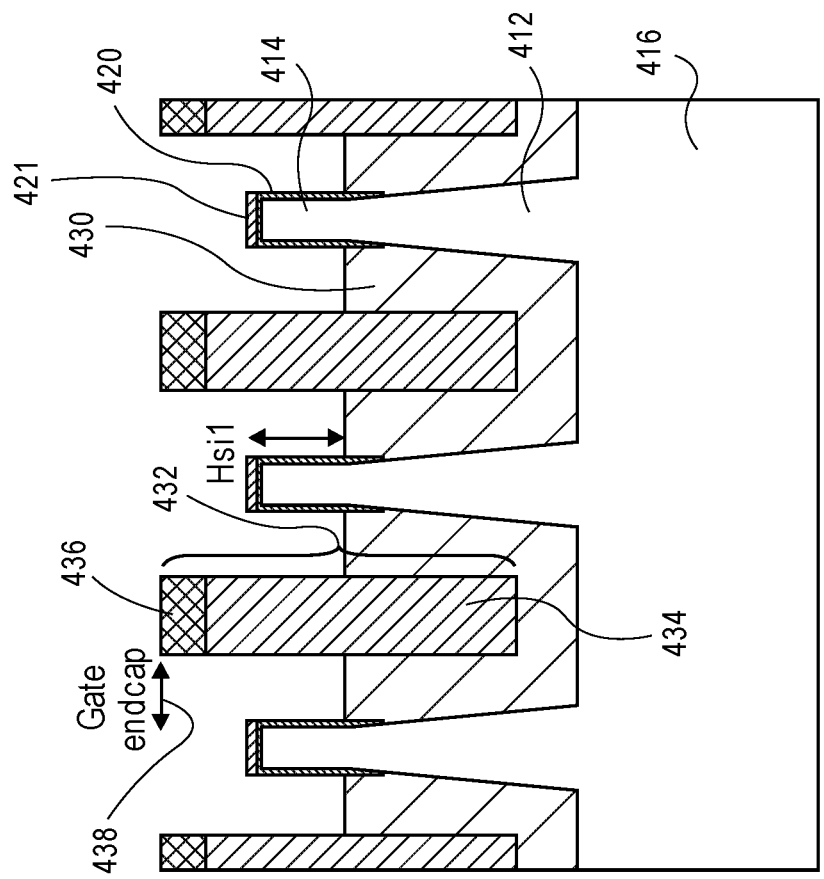
FIG. 5 illustrates a cross-sectional view of a finFET or tri-gate device fabricated using a self-aligned gate edge process fabrication scheme, in accordance with an embodiment of the present invention.

As an exemplary implementation, FIG. 5 illustrates a cross-sectional view of a finFET or tri-gate device fabricated using a self-aligned gate edge process fabrication scheme, in accordance with an embodiment of the present invention.

Referring to FIG. 5, a plurality of fins has lower portions 412 and upper portions 414 above a substrate 416. The upper portions 414 are above an isolation region 430. A plurality of gate edge isolation structures 432, which may include lower dielectric regions 434 and upper dielectric regions 436, is disposed between the fins. A gate end cap spacing 438 is provided between a neighboring fin and gate edge isolation structure 432.

Embodiments described herein may be implemented to provide integration of a self-aligned gate endcap (SAGE) in a CMOS process flow. SAGE may enable transistor scaling by shrinking the gate endcap, reducing gate capacitance and reducing process variations. Previous solutions have focused on improving the registration budget and patterning/resolution improvements to enable shrinking of both gate endcap and end-to-end space. However, embodiments described herein may target improved transistor layout density and gate capacitance (e.g., dynamic energy and performance improvement) with a corresponding reduction in total mask count.

In accordance with one or more embodiments described herein, key aspects of a SAGE process flow may include, but are not limited to or confined by: (1) building a self-aligned "SAGE WALL" in a gate end-to-end space, which is robust to downstream processing, (2) determining a best location for insertion of a patterned shallow trench isolation (STI) recess, which does not compromise the integrity of the SAGE, (3) dummy oxide processing, including selective oxidation of fin-hat ILD for robust protection during poly etch, or (4) void-free poly deposition in the gate endcap space.

In a first processing scheme, SAGE is implemented post STI recessing. As an exemplary flow, FIGS. 6A-6F illustrate cross-sectional views of process operations of significance in another self-aligned gate edge process fabrication scheme for finFET or tri-gate devices, in accordance with an embodiment of the present invention.

Figure 6A:
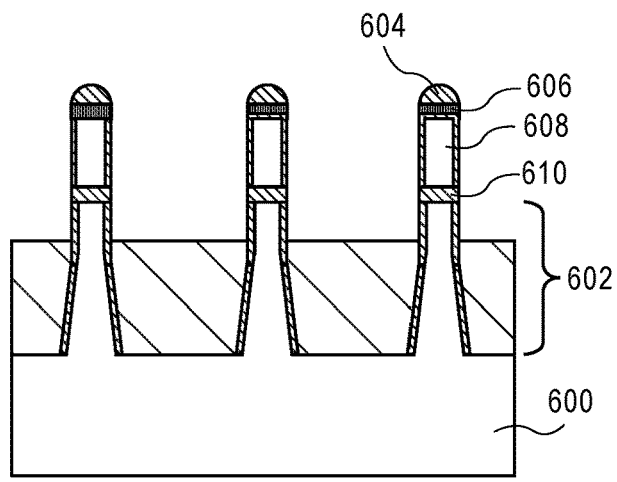
FIGS. 6A-6F illustrate cross-sectional views of process operations of significance in another self-aligned gate edge process fabrication scheme for finFET or tri-gate devices, in accordance with an embodiment of the present invention.

Referring to FIG. 6A, a plurality of semiconductor fins 602 is formed above a substrate 600, such as a plurality of single crystalline silicon fins formed from a single crystalline substrate. In an embodiment, a material stack is disposed above each fin 602. In one such exemplary embodiment, the material stack includes an uppermost hardmask 604, such as a silicon nitride hardmask. The uppermost hardmask 604 is disposed on a buffer hardmask 606, such as a silicon oxide buffer hardmask. The uppermost hardmask 604 and the buffer hardmask 606 are disposed above a patterning film 608, such as a polycrystalline silicon patterning film. A top fin hardmask 610, such as a carbon-doped top fin hardmask is disposed between the patterning film 608 and the plurality of fins 602. It is to be appreciated that, although all fins are shown having the same height (Hsi), the fin heights (e.g., multi Hsi) may be varied based on performance need.

Figure 6B:
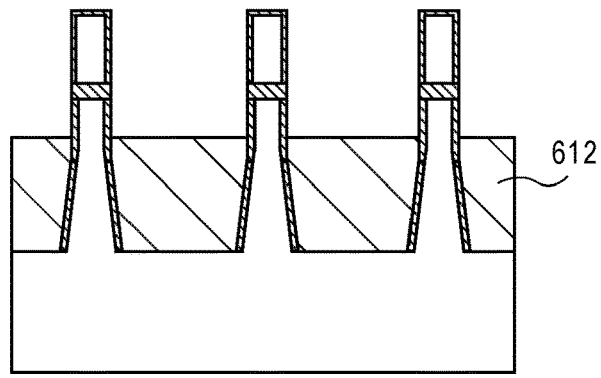

Referring to FIG. 6B, a trench isolation region 612, such as a silicon oxide trench isolation region, is formed laterally adjacent to lower portions of the plurality semiconductor fins 602. The trench isolation region 612 has an uppermost surface below upper portions of the plurality semiconductor fins 602. In an embodiment, the trench isolation region 612 is formed by blanket depositing a silicon oxide material, planarizing the blanket-deposited silicon oxide material, and then recessing the blanket-deposited silicon oxide material below uppermost surfaces of the plurality semiconductor fins 602. In one embodiment, the uppermost hardmask 604 and the buffer hardmask 606 are removed during the formation of the trench isolation region 612, as is depicted in FIG. 6B.

Figure 6C:
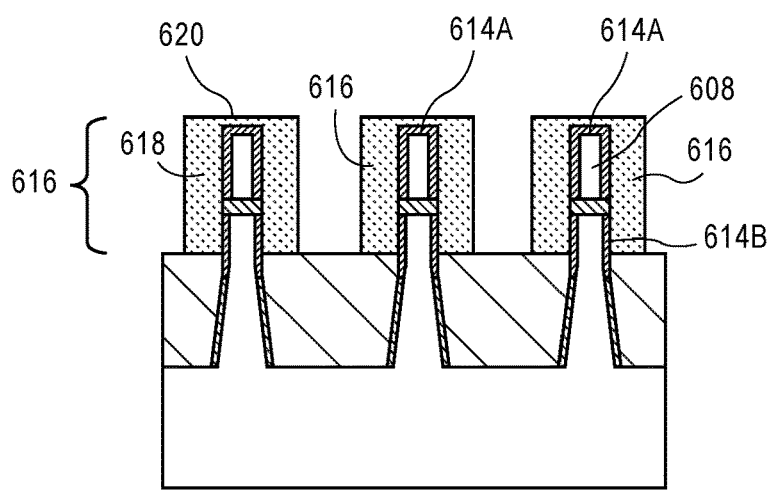

Referring to FIG. 6C, sacrificial spacers 616, such as amorphous silicon spacers, are formed adjacent to sidewalls of the upper portions of each of plurality of semiconductor fins 602 and adjacent the materials remaining above the plurality of semiconductor fins 602. In an embodiment, a conformal deposition and anisotropic etch process is used to form the sacrificial spacers 616. In one such embodiment, sidewall portions 618 are formed with a continuous joining portion 620 over the fins, as is depicted. However, in other embodiments, the continuous joining portion 620 is not retained in the forming of the sacrificial spacers 616. In an embodiment, prior to sacrificial spacers 616, exposed portions of the fins are oxidized. For example, in one embodiment, exposed portions of the patterning film 608 and exposed portions of the fins 602 are oxidized to form oxide layer 614A and oxide layer 614B, respectively, as is depicted in FIG. 6C.

Figure 6D:
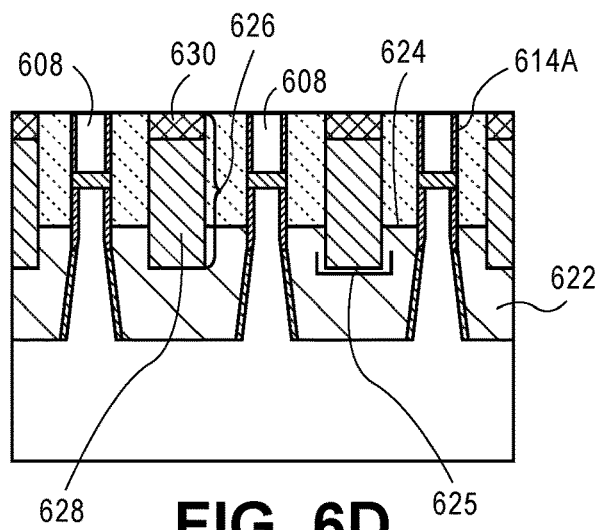

Referring to FIG. 6D, a plurality of gate edge isolation structures 626 is formed between the sacrificial spacers 616. In an embodiment, as depicted, each of the plurality of gate edge isolation structures 626 includes a lower dielectric portion 628 and a dielectric cap 630 on the lower dielectric portion 628. The dielectric cap 630 is separate and distinct from the lower dielectric portion 628 of the gate edge isolation structures 626. In an embodiment, the plurality of gate edge isolation structures 626 is formed by depositing and then recessing a first dielectric material, such as a silicon nitride layer, to provide the lower dielectric portions 628. A dielectric cap material, such as a metal oxide material (e.g., hafnium oxide) is then formed in recessed regions above the lower dielectric portions 628. The dielectric cap material may be planarized to form the dielectric cap 630 or may be grown upward to provide the dielectric cap 630 directly. In an embodiment of the former case, the continuous portion 620 (if present) and the upper most surface of oxide layer 614A (if present) are removed during the planarization process to expose the patterning film 608, as is depicted in FIG. 6D.

Referring again to FIG. 6D, in an embodiment, prior to forming the plurality of gate edge isolation structures 626, exposed portions of the trench isolation region 612 are recessed to provide topographical trench isolation region 622. In particular, recesses 625 are formed at locations of exposed portions of the trench isolation region 612. The recesses 625 are below an uppermost surface 624 of the trench isolation region 612, now topographical trench isolation region 622. In an embodiment, the plurality of gate edge isolation structures 626 is formed in the recesses 625 and, as such, are formed below the uppermost surface 624 of the trench isolation region 612, now topographical trench isolation region 622. In a particular embodiment, the gate edge isolation structures 626 are structurally anchored by being formed in the recesses 625.

Figure 6E:
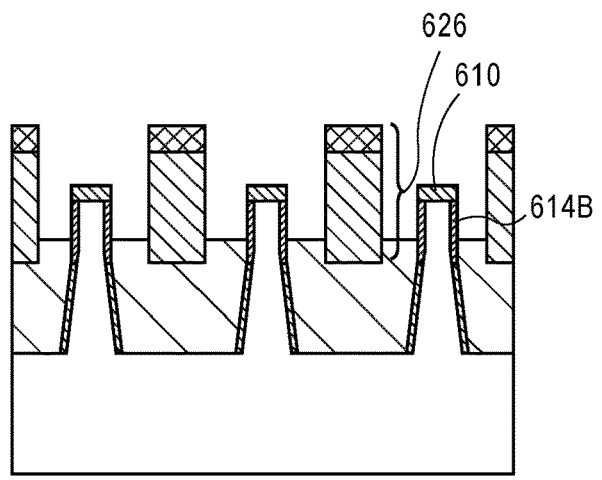

Referring to FIG. 6E, the sacrificial spacers 616 are removed. In an embodiment, the sacrificial spacers 616 are removed by a wet etch or dry etch process. In one such embodiment, the patterning film 608 and the remaining portions of the oxide layer 614A are removed during or subsequent to the removal of the sacrificial spacers 616. In one such embodiment, the top fin hardmask 610 is exposed at this stage.

Figure 6F:
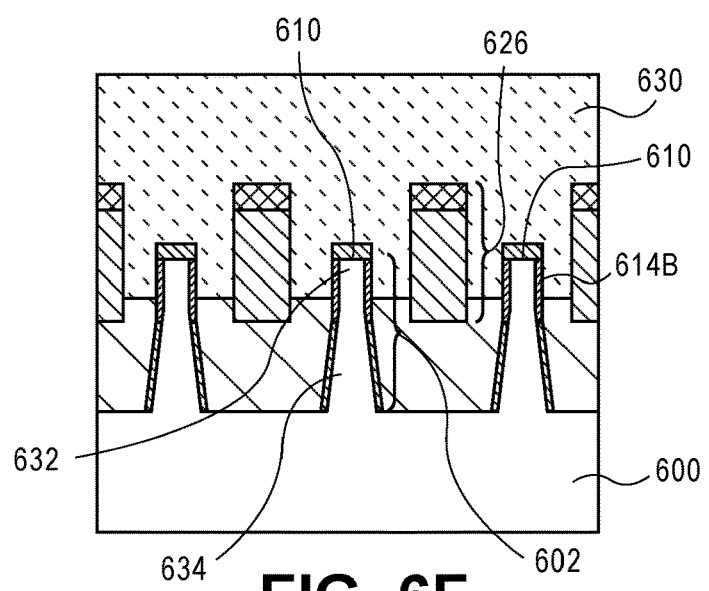

Referring to FIG. 6F, a gate structure 630 is formed over the structure of FIG. 6E. The structure of FIG. 6F includes the plurality of fins 602 with upper portions 632 and lower portions 634. The upper portions 632 are between but lower than the gate edge isolation structures 626. Also, the upper portions 632 are above the uppermost surface 624 of the trench isolation region 612/622. Although shown as retained in FIG. 6F, it is to be appreciated that top fin hardmask 610 can be removed prior to gate structure 630 formation. In other embodiments, top fin hardmask 610 may be subsequently removed in final gate processing to provide a tri-gate finFET device, or may be ultimately retained to provide a double gate finFET device. Additionally, the oxide portions 614B can be removed prior to gate structure 630 formation, or may be subsequently removed in final gate processing, e.g., at a replacement gate process.

Referring again to FIGS. 6A-6F, in an embodiment, a starting Si stack for a SAGE flow has a finfet hat and poly Si between fin-top and hardmask. Processing follows a conventional FINFET flow through fin patterning and STI recess. Subsequently, disposable spacers are deposited around the fins and poly-top to define the gate endcap size. This is followed by filling the end-to-end space with a low dielectric constant material (e.g., SiN/SiOCN) and an etch resistant cap (e.g. metal oxides), which together forms the SAGE wall. In one embodiment, the dielectric constant of the wall core is low to minimize fringe capacitance, and the top of the wall has an etch resistant cap to minimize wall erosion during downstream processing. A SAGE planarization or polish operation defines the height of the wall above fin. After the SAGE polish operation, disposable spacers are removed, and fins are covered by protective oxide and gate poly deposited on thereon.

Following the processing described up to and including FIG. 6F, additional gate structure 630 may be formed. In an embodiment, the gate structure 630 is then recessed to a height below the height of the gate edge isolation structures 626. In another embodiment, the gate structure 630 is first processed through a replacement gate process and then ultimately subjected to a recessing to a height below the height of the gate edge isolation structures 626. In either case, in accordance with an embodiment of the present invention, following subsequent processing, the plurality of gate edge isolation structures 626 breaks a continuity of the gate structure 630 or ultimate permanent gate structure into segments, e.g., as described above in association with FIGS. 3C and 3D and as described below in association with FIGS. 8A and 8B.

In an embodiment, the method further includes forming a local interconnect over the gate structure and over the plurality of gate edge isolation structures, e.g., as described above in association with FIG. 3D and as described below in association with FIG. 8A. The local interconnect electrically connects one or more segments of the gate structure. In one embodiment, the method further includes forming a one or more dielectric plugs that break a continuity of the local interconnect, e.g., as is described above in association with FIG. 3D and as described below in association with FIG. 8A.

In a second processing scheme, SAGE is implemented pre STI recessing. As an exemplary flow, FIGS. 7A-7F illustrate cross-sectional views of process operations of significance in another self-aligned gate edge process fabrication scheme for finFET or tri-gate devices, in accordance with an embodiment of the present invention.

Figure 7A:
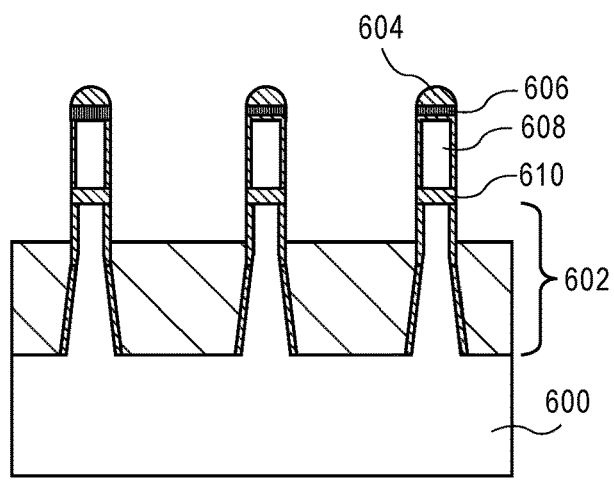
FIGS. 7A-7F illustrate cross-sectional views of process operations of significance in another self-aligned gate edge process fabrication scheme for finFET or tri-gate devices, in accordance with an embodiment of the present invention.

Referring to FIG. 7A, a plurality of semiconductor fins 602 is formed above a substrate 600, such as a plurality of single crystalline silicon fins formed from a single crystalline substrate. In an embodiment, a material stack is disposed above each fin 602. In one such exemplary embodiment, the material stack includes an uppermost hardmask 604, such as a silicon nitride hardmask. The uppermost hardmask 604 is disposed on a buffer hardmask 606, such as a silicon oxide buffer hardmask. The uppermost hardmask 604 and the buffer hardmask 606 are disposed above a patterning film 608, such as a polycrystalline silicon patterning film. A top fin hardmask 610, such as a carbon-doped top fin hardmask is disposed between the patterning film 608 and the plurality of fins 602. It is to be appreciated that, although all fins are shown having the same height (Hsi), the fin heights (e.g., multi Hsi) may be varied based on performance need.

Figure 7B:
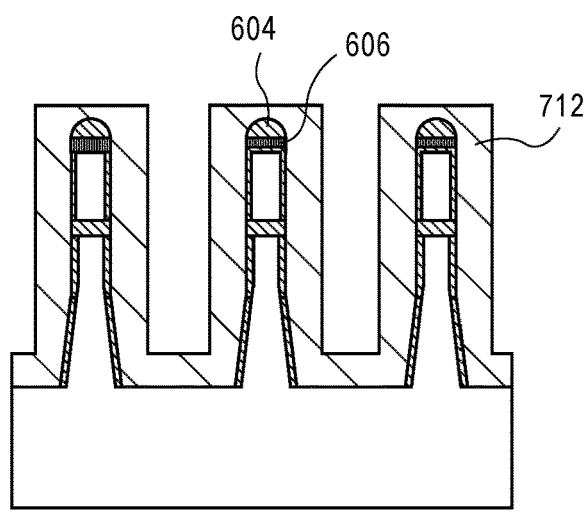

Referring to FIG. 7B, a trench isolation material 712 is formed over and conformal with the plurality of semiconductor fins 602. In an embodiment, the trench isolation material 712 is formed by conformal deposition of a silicon oxide material over the structure of FIG. 7A.

Figure 7C:
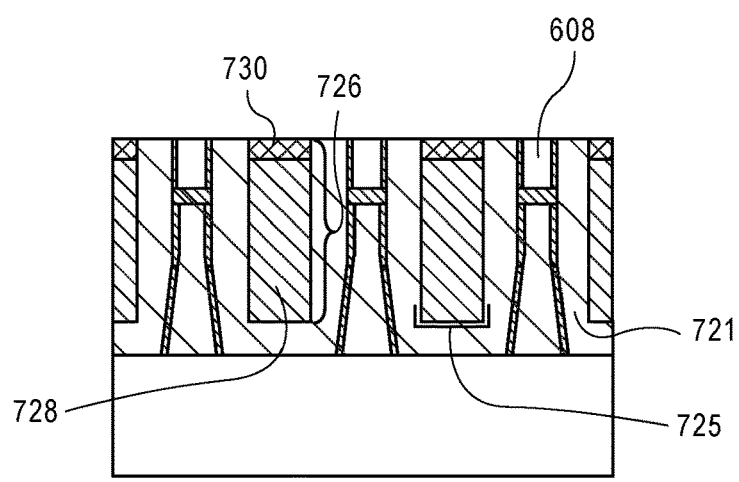

Referring to FIG. 7C, a plurality of gate edge isolation structures 726 is formed between regions of the trench isolation material 712. In an embodiment, as depicted, each of the plurality of gate edge isolation structures 726 includes a lower dielectric portion 728 and a dielectric cap 730 on the lower dielectric portion 728. The dielectric cap 730 is separate and distinct from the lower dielectric portion 728 of the gate edge isolation structures 726. In an embodiment, the plurality of gate edge isolation structures 726 is formed by depositing and then recessing a first dielectric material, such as a SiN layer, a SiCN layer, a SiOCN layer, a SiOC layer, or a SiC layer, to provide the lower dielectric portions 728. In one embodiment, the first dielectric material is a silicon nitride layer. A dielectric cap material, such as a metal oxide material (e.g., hafnium oxide, hafnium aluminum oxide, or aluminum oxide) is then formed in recessed regions above the lower dielectric portions 728. In one embodiment, the metal oxide material is hafnium oxide. In another embodiment, the dielectric cap material is a low-k dielectric material. The dielectric cap material may be planarized to form the dielectric cap 730 or may be grown upward to provide the dielectric cap 730 directly. In an embodiment of the former case, upper layers are removed during the planarization process to expose the patterning film 608, as is depicted in FIG. 7C. Additionally, the trench isolation material 712 is now a discontinuous trench isolation material 721 since the portions over the fins are removed. Although not fabricated as such, gate edge isolation structures 726 are effectively recessed within "recesses" 725 of the trench isolation material 721.

Figure 7D:
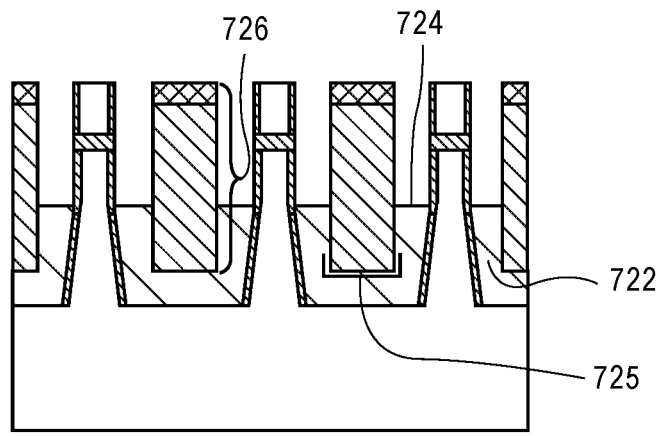

Referring to FIG. 7D, subsequent to forming the plurality of gate edge isolation structures 726, the trench isolation material 721 is recessed to form a trench isolation region 722. An uppermost surface 724 of the trench isolation material 721 is below an upper portion of the fins 602 but is above the "recesses" 725 in which the gate edge isolation structures 726 are formed. In a particular embodiment, the gate edge isolation structures 726 are structurally anchored by being formed in the recesses 725.

Figure 7E:
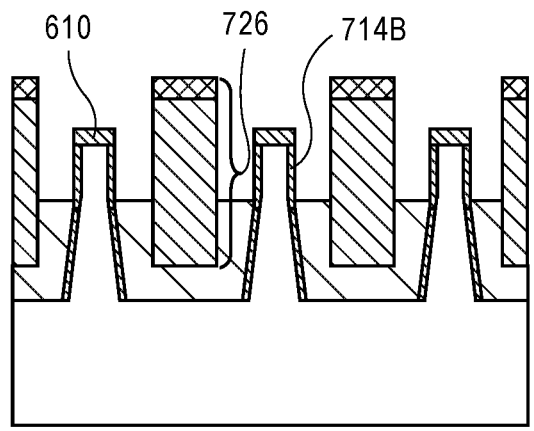

Referring to FIG. 7E, the patterning film 608 is removed. In an embodiment, the patterning film 608 is removed using a dry etch process or a wet etch process. In one such embodiment, the top fin hardmask 610 is exposed at this stage, as is depicted in FIG. 7E. Optionally, oxide portions 714B may be formed at exposed surfaces of the fins 602, as is also depicted in FIG. 7E.

Figure 7F:
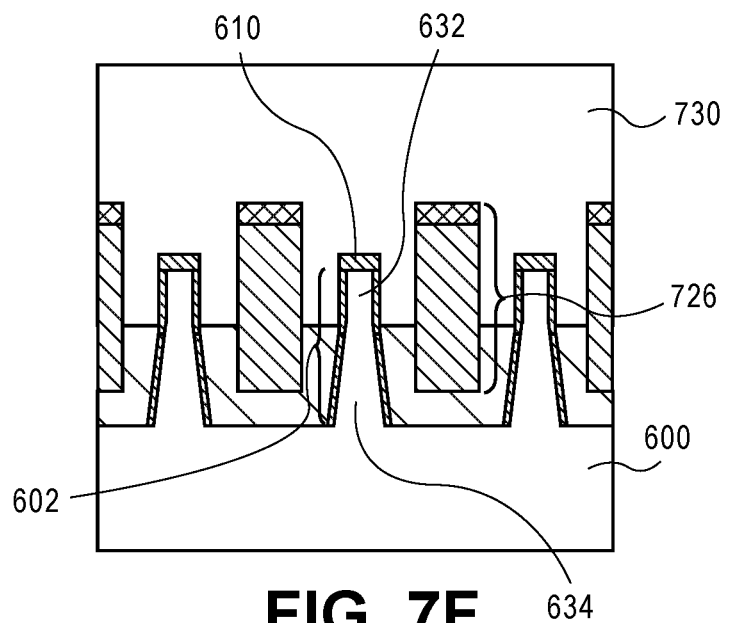

Referring to FIG. 7F, a gate structure 630 is formed over the structure of FIG. 7E. The structure of FIG. 7F includes the plurality of fins 602 with upper portions 632 and lower portions 634. The upper portions 632 are between but lower than the gate edge isolation structures 626. Also, the upper portions 632 are above the uppermost surface 724 of the trench isolation region 722. Although shown as retained in FIG. 7F, it is to be appreciated that top fin hardmask 610 can be removed prior to gate structure 730 formation. In other embodiments, top fin hardmask 610 may be subsequently removed in final gate processing to provide a tri-gate finFET device, or may be ultimately retained to provide a double gate finFET device. Additionally, the oxide portions 714B can be removed prior to gate structure 730 formation, or may be subsequently removed in final gate processing, e.g., at a replacement gate process.

Referring again to FIGS. 7A-7F, in an embodiment, the starting stack for this process is same the same as described in association with FIG. 6A. However, disposable dielectric spacers are the deposited immediately after fin patterning. This is followed by SAGE wall film deposition and SAGE polish. It is to be appreciated that no STI polish is needed in this flow. SAGE wall polish is followed by STI recess to define Hsi. It is also to be appreciated that the process may involve merged SAGE spacer deposition in certain design rule devices where fins are close to each other. In one embodiment, advantage of this second process flow may include that the SAGE wall is buried deep into STI and, thus, SAGE wall integrity may be improved over the first processing scheme.

Following the processing described up to and including FIG. 7F, additional gate structure 730 may be formed. In an embodiment, the gate structure 730 is then recessed to a height below the height of the gate edge isolation structures 726. In another embodiment, the gate structure 730 is first processed through a replacement gate process and then ultimately subjected to a recessing to a height below the height of the gate edge isolation structures 726. In either case, in accordance with an embodiment of the present invention, following subsequent processing, the plurality of gate edge isolation structures 726 breaks a continuity of the gate structure 730 or ultimate permanent gate structure into segments, e.g., as described above in association with FIGS. 3C and 3D and as described below in association with FIGS. 8A and 8B.

In an embodiment, the method further includes forming a local interconnect over the gate structure and over the plurality of gate edge isolation structures, e.g., as described above in association with FIG. 3D and as described below in association with FIG. 8A. The local interconnect electrically connects one or more segments of the gate structure. In one embodiment, the method further includes forming a one or more dielectric plugs that break a continuity of the local interconnect, e.g., as is described above in association with FIG. 3D and as described below in association with FIG. 8A.

In accordance with an embodiment of the present invention, relevant to both SAGE processes 6A-6F and 7A-7F, a dielectric layer is formed on top of fins (fin-hat), which protects the fin during poly etch. The fin-hat layer may be composed on nitrogen and carbon rich material to withstand STI recess processing. However poly etch processing tends to have more selectivity against O-rich dielectrics. In one embodiment, the fin-hat layer is "partially converted" into Si oxide by a high dose, low energy O-implant. This process may be implemented to increase the protection on fin-top during poly etch, which is typically the weakest stage of the flow. The fin-hat layer can also be "fully oxidized", which can be used to change the device architecture from FINFET to tri-gate.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances. In one embodiment, no extra mask steps are needed to create the endcaps, contacts and local interconnect lines so the many masks needed for such features in the standard process are eliminated.

More specifically, key features of one or more embodiments described above may include one or more of: (1) the gate endcap is the distance from the fin edge to the isolation edge. This distance is defined by the spacer width and is the same size for all transistors. No lithographic patterning is needed to define the endcap so there is no need to allow for mask registration in the endcap. (2) The TCN overlap of the fin is determined by the spacer width and is also not affected by mask registration. (3) The local interconnect lines are self-aligned to the gate and TCN by utilizing the gate patterning lines above the transistor isolation walls. Embodiments may be applicable to the 7 nm node generation, e.g., to improve transistor layout density and gate capacitance (dynamic energy and performance improvement) and reduce total mask count.

It is to be appreciated that the structures resulting from the above exemplary processing schemes may be used in a same or similar form for subsequent processing operations to complete device fabrication, such as PMOS and NMOS device fabrication. As an example of a completed device, FIGS. 8A and 8B illustrate a cross-sectional view and a plan view (taken along the a-a' axis of the cross-sectional view), respectively, of a non-planar semiconductor device having self-aligned gate edge isolation, in accordance with an embodiment of the present invention, and as building on the structure described in association with FIG. 6F or 7F.

Figure 8A:
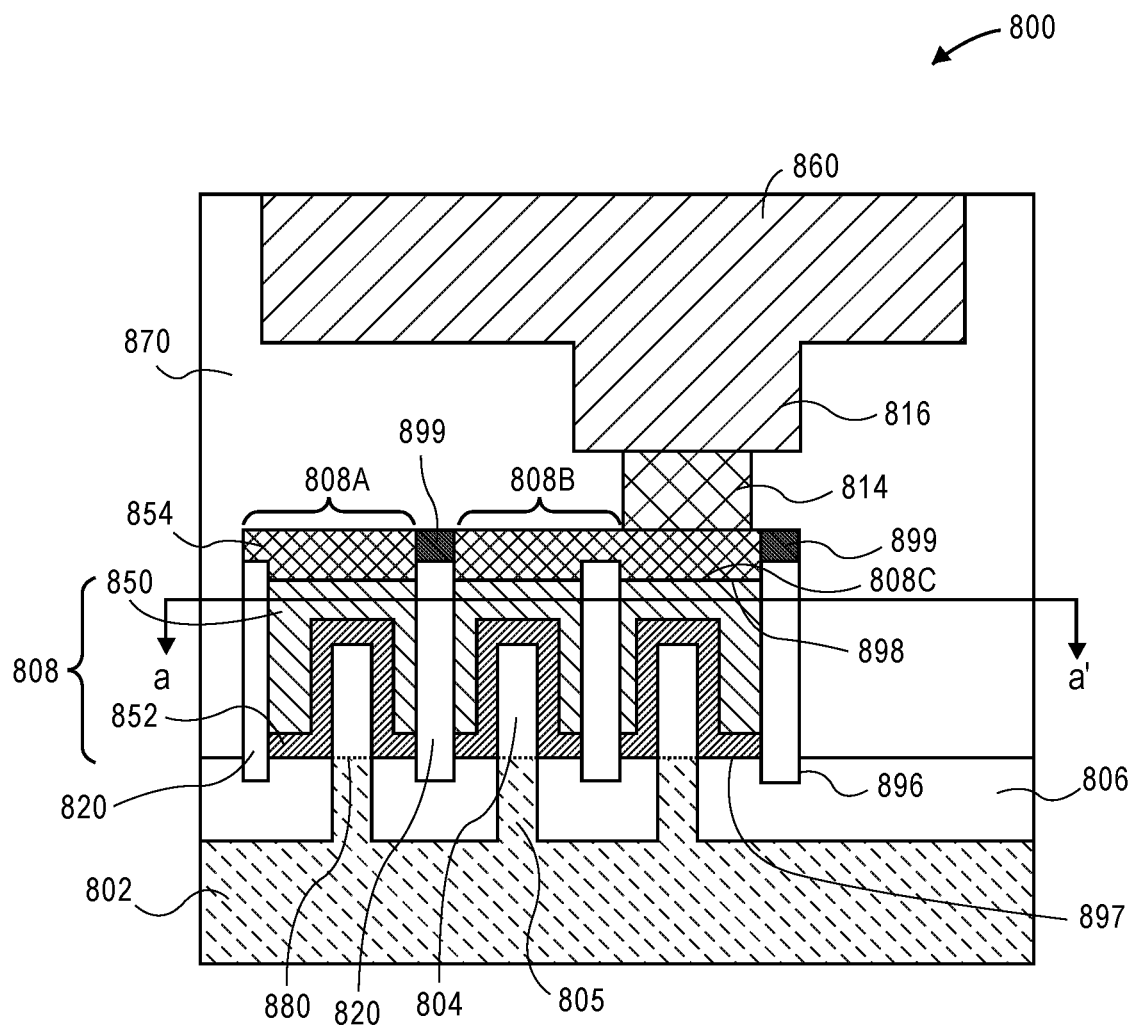
FIG. 8A illustrates a cross-sectional view of a non-planar semiconductor device having self-aligned gate edge isolation, in accordance with an embodiment of the present invention.
Figure 8B:
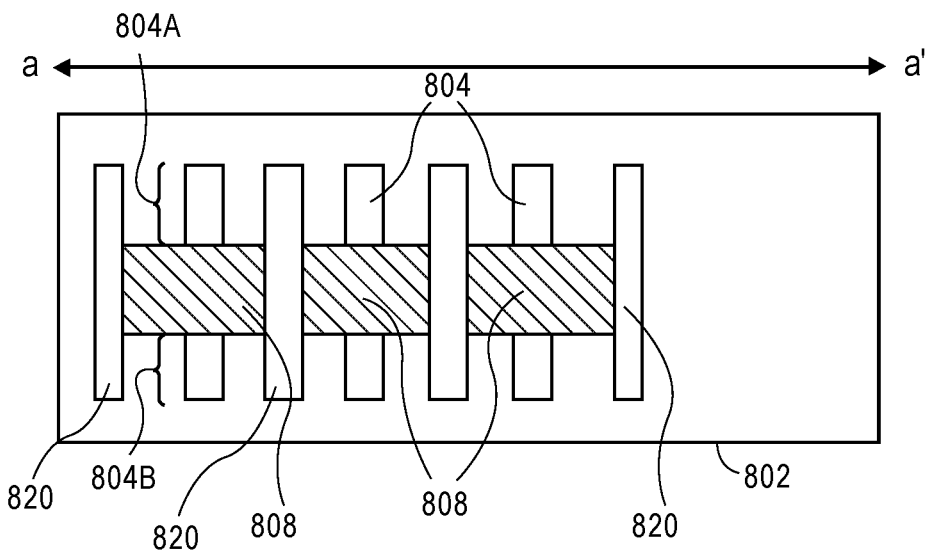
FIG. 8B illustrates a plan view taken along the a-a' axis of the semiconductor device of FIG. 8A, in accordance with an embodiment of the present invention.

Referring to FIG. 8A, a semiconductor structure or device 800 includes a non-planar active regions (e.g., a fin structures including protruding fin portion 804 and sub-fin region 805) formed from substrate 802, and within isolation region 806. Gate structures 808 are disposed over the protruding portions 804 of the non-planar active regions as well as over a portion of the isolation region 806. As shown, gate structures 808 include a gate electrode 850 and a gate dielectric layer 852. In one embodiment, although not shown, gate structures 808 may also include a dielectric cap layer.

Gate structures 808 are separated by self-aligned gate edge isolation structures 820. In accordance with an embodiment of the present invention, each of the by self-aligned gate edge isolation structures 820 is recessed below an uppermost surface 897 of the isolation region 806, as is depicted in FIG. 8A. A local interconnect 854 couples adjacent gate structures 808. In accordance with an embodiment of the present invention, dielectric plugs 899 may be included to break the continuity of the local interconnect 854, as is also depicted in FIG. 8A.

A gate contact 814, and overlying gate contact via 816 are also seen from this perspective, along with an overlying metal interconnect 860, all of which are disposed in interlayer dielectric stacks or layers 870. Also seen from the perspective of FIG. 8A, the gate contact 814 is, in one embodiment, disposed over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as disposed over the protruding fin portions 804, as isolated by self-aligned gate edge isolation structures 820. Source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the semiconductor structure or device 800 is a non-planar device such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a III-V material and the charge-carrier dopant impurity atoms are ones such as, but not limited to, carbon, silicon, germanium, oxygen, sulfur, selenium or tellurium.

Isolation region 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

Self-aligned gate edge isolation structures 820 may be composed of a material or materials suitable to ultimately electrically isolate, or contribute to the isolation of, portions of permanent gate structures from one another. Exemplary materials or material combinations are described above.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, and overlying gate contact via 816 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc. It is to be appreciated that a hardmask layer may be disposed on the local interconnect 854 in locations where gate contact 814 is not located thereon. Furthermore, the local interconnect 854 may be fabricated by lithographic patterning or, in other embodiments, may be fabricated as a self-aligned interconnect structure, as aligned with taller versions of the self-aligned gate edge isolation structures 820.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

With reference again to FIGS. 8A and 8B, in accordance with an embodiment of the present invention, a semiconductor structure 800 includes a plurality of semiconductor fins 804 disposed above a substrate 802 and protruding through an uppermost surface 897 of a trench isolation region 806. A gate structure 808 is disposed over the plurality of semiconductor fins 804. The gate structure 808 defines a channel region in each of the plurality of semiconductor fins 804. Source and drain regions 804A and 804B are on opposing ends of the channel regions of each of the plurality of semiconductor fins 804, at opposing sides of the gate structure 808. The semiconductor structure 800 also includes a plurality of gate edge isolation structures 820, which may also be referred to as gate walls. Individual ones of the plurality of gate edge isolation structures 820 alternate with individual ones of the plurality of semiconductor fins 804. Individual ones of the plurality of gate edge isolation structures 820 extend above an uppermost surface 898 of the gate structure 808. In one such embodiment, the plurality of gate edge isolation structures 820 break continuity of the gate structure 808 into segments, e.g., 808A, 808B and 808C. In an embodiment, individual ones of the plurality of gate edge isolation structures 820 are disposed in a corresponding recess 896 below the uppermost surface 897 of the trench isolation region 806.

In an embodiment, the semiconductor structure 808 further includes a local interconnect 854 disposed over the gate structure 808 and over the plurality of gate edge isolation structures 820. The local interconnect electrically connects one or more segments 808A, 808B and 808C of the gate structure 808. In one embodiment, a continuity of the local interconnect 854 is broken by one or more dielectric plugs 899.

It is to be appreciated that fabrication of gate edge isolation structures may lead to formation of a seam within the gate edge isolation structures. It is also to be appreciated that gate edge isolation structures may differ depending on the spacing of adjacent fins. As an example covering both aspects, FIGS. 9A-9C illustrate cross-sectional views of process operations of significance in another self-aligned gate edge process fabrication scheme for finFET or tri-gate devices, in accordance with an embodiment of the present invention.

Figure 9A:
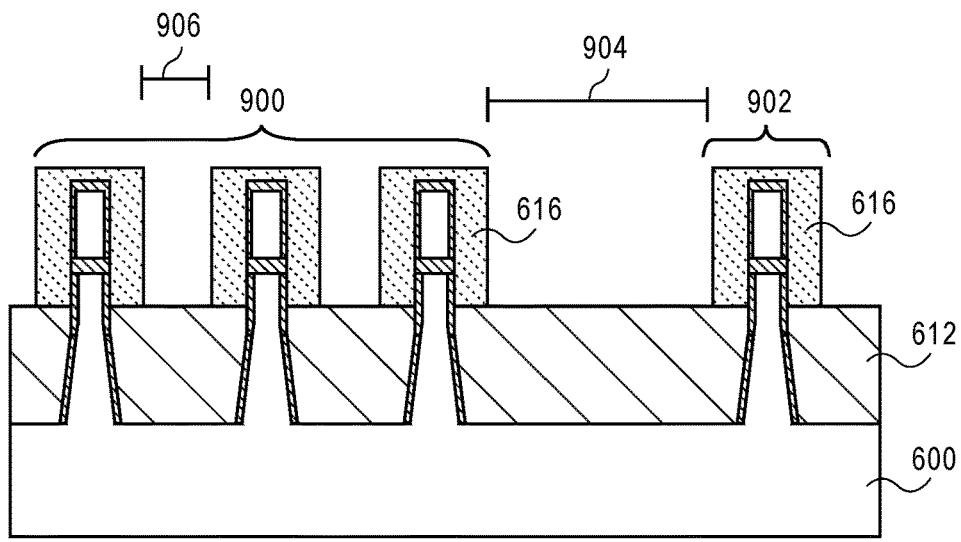
FIGS. 9A-9C illustrate cross-sectional views of process operations of significance in another self-aligned gate edge process fabrication scheme for finFET or tri-gate devices, in accordance with an embodiment of the present invention.

Referring to FIG. 9A, a grouping of fins 900 has a spacing 906. The grouping of fins 900 is adjacent to a fin 902 by a larger spacing 904. Sacrificial spacers 616 are formed adjacent to sidewalls of the upper portions of each of plurality of semiconductor fins 900 and 902.

Figure 9B:
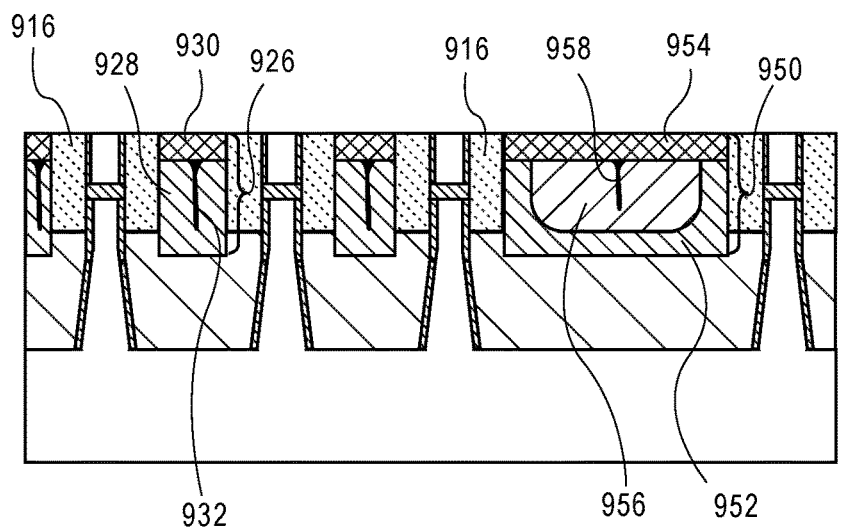
Figure 9C:
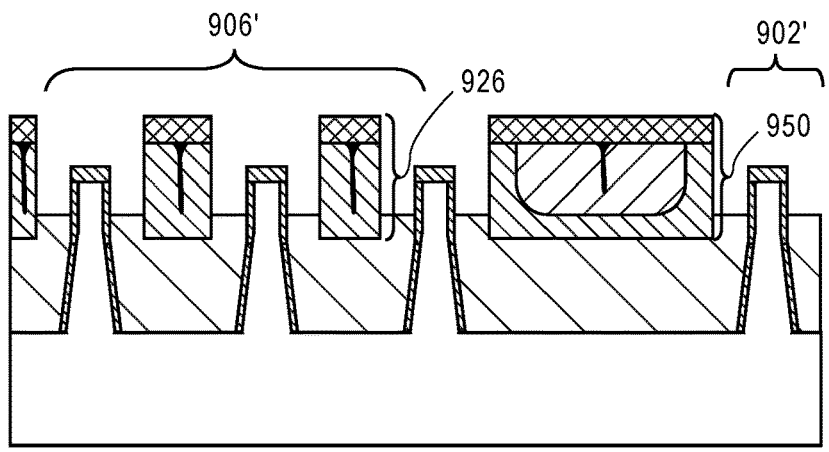

Referring to FIG. 9B, a plurality of gate edge isolation structures 926 and 950 is formed between the sacrificial spacers 616. In an embodiment, as depicted, each of the plurality of gate edge isolation structures 926 formed between spacings 906 includes a lower dielectric portion 928 and a dielectric cap 930 on the lower dielectric portion 928. In an embodiment, the plurality of gate edge isolation structures 926 is formed by depositing and then recessing a first dielectric material, such as a silicon nitride layer, to provide the lower dielectric portions 928. The deposition process may be a conformal process which, in one embodiment, provides seams 932 within the lower dielectric portion 928. Thus, in an embodiment, each of the plurality of gate edge isolation structures 926 includes a vertical seam 932 centered within the gate edge isolation structure 926. A dielectric cap material, such as a metal oxide material (e.g., hafnium oxide) is then formed in recessed regions above the lower dielectric portions 928. The dielectric cap material may be planarized to form the dielectric cap 930 or may be grown upward to provide the dielectric cap 930 directly.

Referring again to FIG. 9B, in an embodiment, a gate edge isolation structure 926 is between semiconductor fins having a spacing 906 and a gate edge isolation structure 950 is between semiconductor fins having a spacing 904. The gate edge isolation structure 926 has a width narrower than a corresponding width of gate edge isolation structure 950. In one embodiment, the gate edge isolation structure 926 has a total composition different than a total composition of the gate edge isolation structure 950. In one such embodiment, gate edge isolation structure 950 further includes a third dielectric layer 956, such as a layer of silicon oxide on a bottom portion of and within sidewalls of a lower dielectric portion 952. A dielectric cap 952 is further on the third dielectric layer 956. In an embodiment, the sidewalls of the lower dielectric portion 952 have an uppermost surface approximately co-planar with an uppermost surface of the third dielectric layer 956, and the dielectric cap 952 has a substantially planar bottommost surface, as is depicted in FIG. 9B. In another embodiment, the sidewalls of the lower dielectric portion 952 have an uppermost surface below an uppermost surface of the third dielectric layer 956, and the dielectric cap 952 extends further down over the sidewall locations. In yet another embodiment, the sidewalls of the lower dielectric portion 952 have an uppermost surface above an uppermost surface of the third dielectric layer 956, and the dielectric cap 952 extends further down over the third dielectric layer 956.

In an embodiment, the deposition process of layer 956 is a conformal process which, in one embodiment, provides vertical seams 958 within the third dielectric layer 956. However, in another embodiment, a seam 958 is not formed in wider structures but is formed in narrower structures (e.g., seam 932 described above). It is to be appreciated that layers 928 and 952 may be composed of a same material, such as silicon nitride, and formed at a same time as one another. It is also to be appreciated that layers 930 and 954 may be composed of a same material, such as hafnium oxide, and formed at a same time as one another. The third dielectric layer 956 in structure 950 but omitted from structure 926 may be formed by conformal deposition across the entire structure but is excluded from structures 926 since the layer 928 essentially fills the spacing 906 in a first deposition process which does not entirely fill the spacing 904.

Referring to FIG. 9C, the sacrificial spacers 616 are removed. In an embodiment, the sacrificial spacers 616 are removed by a wet etch or dry etch process. In an embodiment, patterning stack layers above the fins are also removed to provide fins 906' and 902'. Thus, in an embodiment, a gate edge isolation structure includes a vertical seam within the gate edge isolation structure. In an embodiment, gate edge isolation structures differ in width and/or composition depending on the spacing of adjacent fins.

Figure 10:
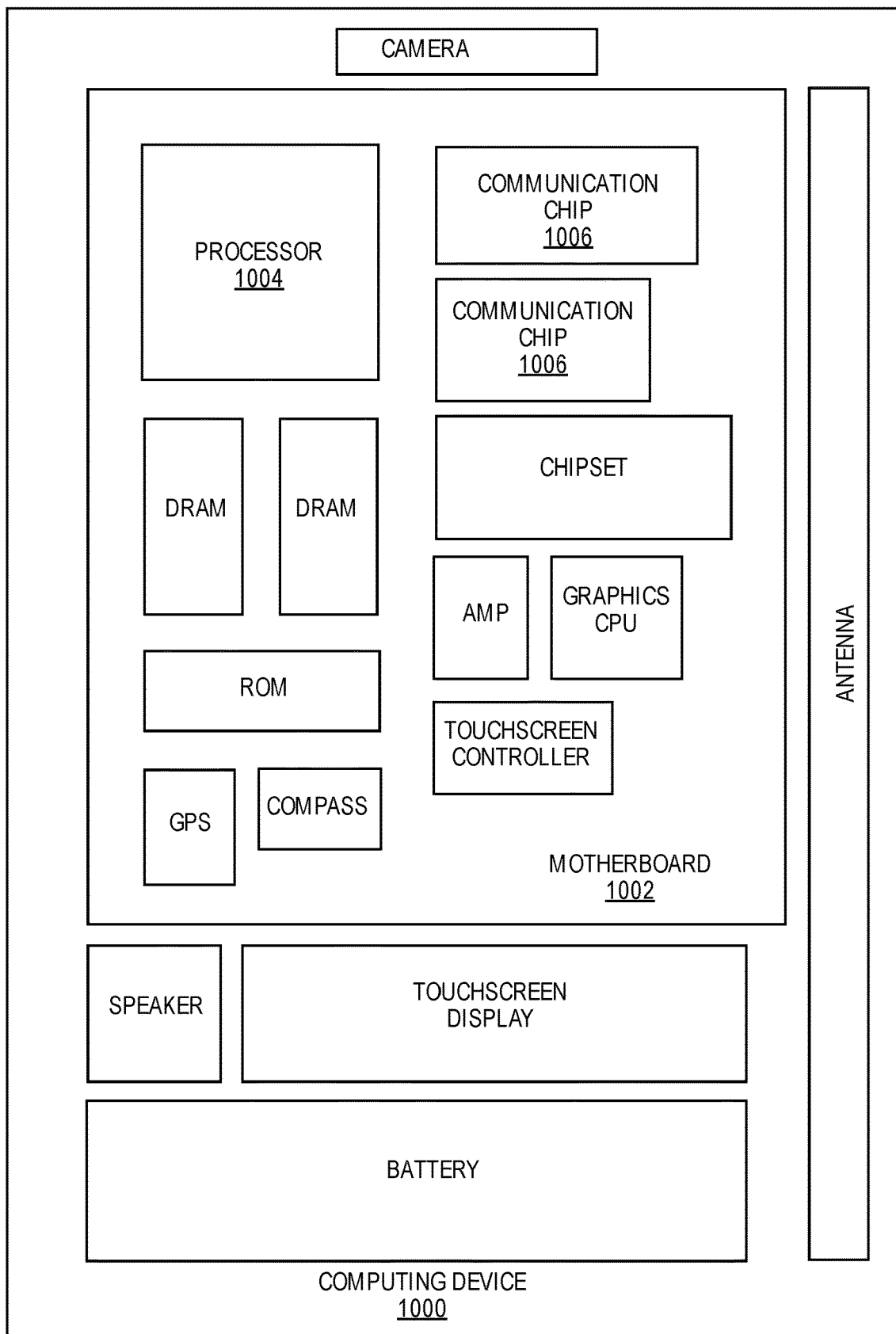
FIG. 10 illustrates a computing device in accordance with one implementation of an embodiment of the invention.

FIG. 10 illustrates a computing device 1000 in accordance with one implementation of the invention. The computing device 1000 houses a board 1002. The board 1002 may include a number of components, including but not limited to a processor 904 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
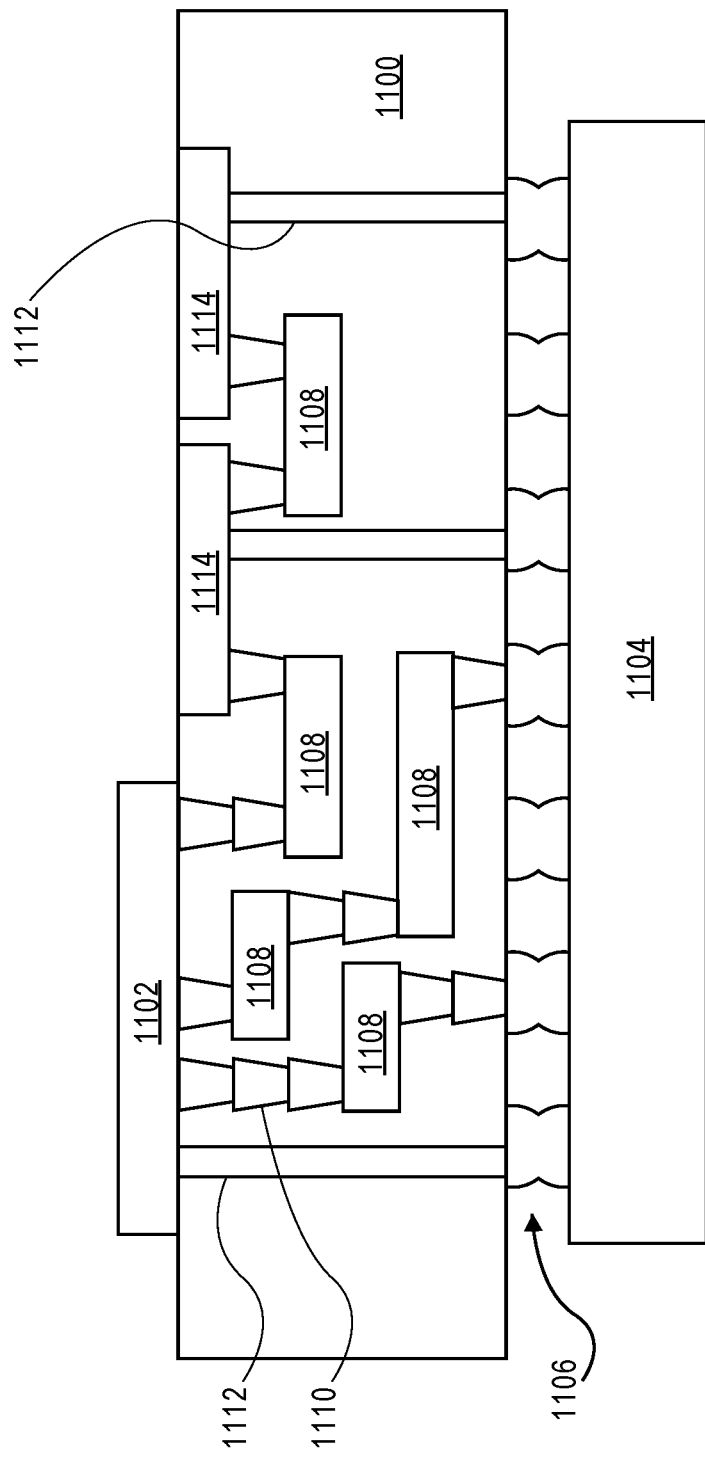
FIG. 11 illustrates an interposer that includes one or more embodiments of the invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100.

Thus, embodiments of the present invention include self-aligned gate edge trigate and finFET devices and methods of fabricating self-aligned gate edge trigate and finFET devices.

In an embodiment, a semiconductor structure includes a plurality of semiconductor fins disposed above a substrate and protruding through an uppermost surface of a trench isolation region. A gate structure is disposed over the plurality of semiconductor fins. The gate structure defines a channel region in each of the plurality of semiconductor fins. Source and drain regions are on opposing ends of the channel regions of each of the plurality of semiconductor fins, at opposing sides of the gate structure. The semiconductor structure also includes a plurality of gate edge isolation structures. Individual ones of the plurality of gate edge isolation structures alternate with individual ones of the plurality of semiconductor fins. Individual ones of the plurality of gate edge isolation structures are disposed in a corresponding recess below the uppermost surface of the trench isolation region and extend above an uppermost surface of the gate structure and break continuity of the gate structure into segments.

In one embodiment, the semiconductor structure further includes a local interconnect disposed over the gate structure and over the plurality of gate edge isolation structures. The local interconnect electrically connects one or more segments of the gate structure.

In one embodiment, a continuity of the local interconnect is broken by one or more dielectric plugs.

In one embodiment, each of the plurality of gate edge isolation structures includes a lower dielectric portion and a dielectric cap on the lower dielectric portion, and separate and distinct from the lower dielectric portion.

In one embodiment, the lower dielectric portion includes silicon nitride and the dielectric cap includes hafnium oxide.

In one embodiment, each of the plurality of gate edge isolation structures further includes a layer of silicon oxide on a bottom portion of and within sidewalls of the lower dielectric portion. The dielectric cap is further on the layer of silicon oxide.

In one embodiment, each of the plurality of gate edge isolation structures includes a vertical seam centered within the gate edge isolation structure.

In one embodiment, a first and second ones of the plurality of semiconductor fins are neighboring with a first spacing. A third one of the plurality of semiconductor fins is neighboring the second one of the plurality of semiconductor fins with a second spacing larger than the first spacing. A first one of the plurality of gate edge isolation structures is between the first and second ones of the plurality of semiconductor fins has a width narrower than a corresponding width of a second one of the plurality of gate edge isolation structures between the second and third ones of the plurality of semiconductor fins.

In one embodiment, the second one of the plurality of gate edge isolation structures has a total composition different than a total composition of the first one of the plurality of gate edge isolation structures.

In an embodiment, a semiconductor structure includes a plurality of semiconductor fins disposed above a substrate and protruding through a trench isolation region. A gate structure is disposed over the plurality of semiconductor fins. The gate structure defines a channel region in each of the plurality of semiconductor fins. Source and drain regions are on opposing ends of the channel regions of each of the plurality of semiconductor fins, at opposing sides of the gate structure. The semiconductor structure also includes a plurality of gate edge isolation structures. Individual ones of the plurality of gate edge isolation structures are on the trench isolation region and alternate with individual ones of the plurality of semiconductor fins, and break a continuity of the gate structure into segments. Each of the plurality of gate edge isolation structures includes a lower dielectric portion and a dielectric cap on the lower dielectric portion, and separate and distinct from the lower dielectric portion.

In one embodiment, the semiconductor structure further includes a local interconnect disposed over the gate structure and over the plurality of gate edge isolation structures. The local interconnect electrically connects one or more segments of the gate structure.

In one embodiment, a continuity of the local interconnect is broken by one or more dielectric plugs.

In one embodiment, the lower dielectric portion includes silicon nitride and the dielectric cap includes hafnium oxide.

In one embodiment, each of the plurality of gate edge isolation structures further includes a layer of silicon oxide on a bottom portion of and within sidewalls of the lower dielectric portion. The dielectric cap is further on the layer of silicon oxide.

In one embodiment, each of the plurality of gate edge isolation structures includes a vertical seam centered within the lower dielectric portion of the gate edge isolation structure.

In one embodiment, a first and second ones of the plurality of semiconductor fins are neighboring with a first spacing. A third one of the plurality of semiconductor fins is neighboring the second one of the plurality of semiconductor fins with a second spacing larger than the first spacing. A first one of the plurality of gate edge isolation structures between the first and second ones of the plurality of semiconductor fins has a width narrower than a corresponding width of a second one of the plurality of gate edge isolation structures between the second and third ones of the plurality of semiconductor fins.

In one embodiment, the second one of the plurality of gate edge isolation structures has a total composition different than a total composition of the first one of the plurality of gate edge isolation structures.

In an embodiment, a method of fabricating a semiconductor structure includes forming a plurality of semiconductor fins above a substrate. Each of the plurality of semiconductor fins has a lower portion and an upper portion. The method also includes forming a trench isolation region laterally adjacent to the lower portions of the plurality semiconductor fins and having an uppermost surface below the upper portions of the plurality semiconductor fins. The method also includes forming sacrificial spacers adjacent to sidewalls of the upper portions of each of plurality of semiconductor fins. The method also includes recessing exposed portions of the trench isolation region between the sacrificial spacers to form recesses in the trench isolation region. The method also includes forming a plurality of gate edge isolation structures between the sacrificial spacers and in the recesses in the trench isolation region. The method also includes removing the sacrificial spacers. The method also includes forming a gate structure over the plurality of semiconductor fins. The plurality of gate edge isolation structures breaks a continuity of the gate structure into segments.

In one embodiment, the method further includes forming a local interconnect over the gate structure and over the plurality of gate edge isolation structures. The local interconnect electrically connects one or more segments of the gate structure.

In one embodiment, the method further includes forming a one or more dielectric plugs that break a continuity of the local interconnect.

In one embodiment, each of the plurality of gate edge isolation structures includes a lower dielectric portion and a dielectric cap on the lower dielectric portion and separate and distinct from the lower dielectric portion.

In an embodiment, a method of fabricating a semiconductor structure includes forming a plurality of semiconductor fins above a substrate. Each of the plurality of semiconductor fins has a lower portion and an upper portion. The method also includes forming a trench isolation material over and conformal with the plurality of semiconductor fins. The method also includes forming a plurality of gate edge isolation structures between regions of the trench isolation material. The method also includes, subsequent to forming the plurality of gate edge isolation structures, recessing the trench isolation material to form a trench isolation region laterally adjacent to the lower portions of the plurality semiconductor fins and having an uppermost surface below the upper portions of the plurality semiconductor fins. The method also includes forming a gate structure over the plurality of semiconductor fins. The plurality of gate edge isolation structures breaks a continuity of the gate structure into segments.

In one embodiment, the method further includes forming a local interconnect over the gate structure and over the plurality of gate edge isolation structures. The local interconnect electrically connects one or more segments of the gate structure.

In one embodiment, the method further includes forming a one or more dielectric plugs that break a continuity of the local interconnect.

In one embodiment, each of the plurality of gate edge isolation structures includes a lower dielectric portion and a dielectric cap on the lower dielectric portion and separate and distinct from the lower dielectric portion.

What is claimed is:
1. A semiconductor structure, comprising:
a plurality of semiconductor fins disposed above a substrate and protruding through an uppermost surface of a trench isolation region;
a gate structure disposed over the plurality of semiconductor fins, the gate structure defining a channel region in each of the plurality of semiconductor fins, and the gate structure having a top surface;

source and drain regions on opposing ends of the channel regions of each of the plurality of semiconductor fins, at opposing sides of the gate structure; and a plurality of gate edge isolation structures, individual ones of the plurality of gate edge isolation structures alternating with individual ones of the plurality of semiconductor fins, and individual ones of the plurality of gate edge isolation structures disposed in a corresponding recess below the uppermost surface of the trench isolation region and extending above an uppermost surface of the gate structure and breaking a continuity of the gate structure into segments, wherein each of the plurality of gate edge isolation structures comprises a lower dielectric portion and a dielectric cap on the lower dielectric portion and separate and distinct from the lower dielectric portion, the lower dielectric portion having a first width, and the dielectric cap having a second width the same as the first width, and wherein an interface between the lower dielectric portion and the dielectric cap is below the top surface of the gate structure.

2. The semiconductor structure of claim 1, further comprising:

a local interconnect disposed over the gate structure and over the plurality of gate edge isolation structures, the local interconnect electrically connecting one or more segments of the gate structure.

3. The semiconductor structure of claim 2, wherein a continuity of the local interconnect is broken by one or more dielectric plugs.

4. The semiconductor structure of claim 1, wherein the lower dielectric portion comprises silicon nitride and the dielectric cap comprises hafnium oxide.

5. The semiconductor structure of claim 4, wherein each of the plurality of gate edge isolation structures further comprises a layer of silicon oxide on a bottom portion of and within sidewalls of the lower dielectric portion, and wherein the dielectric cap is further on the layer of silicon oxide.

6. The semiconductor structure of claim 1, wherein each of the plurality of gate edge isolation structures comprises a vertical seam centered within the gate edge isolation structure.

7. The semiconductor structure of claim 1, wherein a first one and a second one of the plurality of semiconductor fins are neighboring with a first spacing, and a third one of the plurality of semiconductor fins is neighboring the second one of the plurality of semiconductor fins with a second spacing larger than the first spacing, and wherein a first one of the plurality of gate edge isolation structures between the first and second ones of the plurality of semiconductor fins has a width narrower than a corresponding width of a second one of the plurality of gate edge isolation structures between the second and third ones of the plurality of semiconductor fins.

8. The semiconductor structure of claim 7, wherein the second one of the plurality of gate edge isolation structures has a total composition different than a total composition of the first one of the plurality of gate edge isolation structures.

9. A semiconductor structure, comprising:

a plurality of semiconductor fins disposed above a substrate and protruding through a trench isolation region;

a gate structure disposed over the plurality of semiconductor fins, the gate structure defining a channel region in each of the plurality of semiconductor fins, and the gate structure having a top surface;

source and drain regions on opposing ends of the channel regions of each of the plurality of semiconductor fins, at opposing sides of the gate structure; and a plurality of gate edge isolation structures, individual ones of the plurality of gate edge isolation structures on the trench isolation region and alternating with individual ones of the plurality of semiconductor fins and breaking a continuity of the gate structure into segments, and each of the plurality of gate edge isolation structures comprising a lower dielectric portion and a dielectric cap on the lower dielectric portion and separate and distinct from the lower dielectric portion, the lower dielectric portion having a first width, and the dielectric cap having a second width the same as the first width, and wherein an interface between the lower dielectric portion and the dielectric cap is below the top surface of the gate structure.

10. The semiconductor structure of claim 9, further comprising:

a local interconnect disposed over the gate structure and over the plurality of gate edge isolation structures, the local interconnect electrically connecting one or more segments of the gate structure.

11. The semiconductor structure of claim 10, wherein a continuity of the local interconnect is broken by one or more dielectric plugs.

12. The semiconductor structure of claim 9, wherein the lower dielectric portion comprises silicon nitride and the dielectric cap comprises hafnium oxide.

13. The semiconductor structure of claim 12, wherein each of the plurality of gate edge isolation structures further comprises a layer of silicon oxide on a bottom portion of and within sidewalls of the lower dielectric portion, and wherein the dielectric cap is further on the layer of silicon oxide.

14. The semiconductor structure of claim 9, wherein each of the plurality of gate edge isolation structures comprises a vertical seam centered within the lower dielectric portion of the gate edge isolation structure.

15. The semiconductor structure of claim 9, wherein a first and second ones of the plurality of semiconductor fins are neighboring with a first spacing, and a third one of the plurality of semiconductor fins is neighboring the second one of the plurality of semiconductor fins with a second spacing larger than the first spacing, and wherein a first one of the plurality of gate edge isolation structures between the first and second ones of the plurality of semiconductor fins has a width narrower than a corresponding width of a second one of the plurality of gate edge isolation structures between the second and third ones of the plurality of semiconductor fins.

16. The semiconductor structure of claim 15, wherein the second one of the plurality of gate edge isolation structures has a total composition different than a total composition of the first one of the plurality of gate edge isolation structures.

* * * * *